US009612263B2

(12) United States Patent
Murata et al.

(10) Patent No.: US 9,612,263 B2
(45) Date of Patent: Apr. 4, 2017

(54) PHOTOELECTRIC CONVERSION ELEMENT, PHOTOELECTRIC CONVERSION APPARATUS AND SOLID-STATE IMAGING APPARATUS

(75) Inventors: Masaki Murata, Tokyo (JP); Masanori Oka, Kanagawa (JP); Osamu Enoki, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 1391 days.

(21) Appl. No.: 13/024,953

(22) Filed: Feb. 10, 2011

(65) Prior Publication Data

US 2012/0143544 A1 Jun. 7, 2012
US 2016/0195573 A9 Jul. 7, 2016

Related U.S. Application Data

(63) Continuation-in-part of application No. 12/510,392, filed on Jul. 28, 2009, now Pat. No. 8,212,201.

(30) Foreign Application Priority Data

Aug. 5, 2008 (JP) ................................ 2008-202296
Feb. 17, 2010 (JP) ................................ 2010-032179
Jan. 14, 2011 (JP) ................................ 2011-005620

(51) Int. Cl.
*H01L 31/09* (2006.01)
*G01R 19/00* (2006.01)
(Continued)

(52) U.S. Cl.
CPC .... *G01R 19/0092* (2013.01); *H01L 27/14609* (2013.01); *H01L 27/14665* (2013.01);
(Continued)

(58) Field of Classification Search
CPC ......... G06F 19/00; G01R 19/00; H01L 31/02; H01L 51/42; H01L 31/09
(Continued)

(56) References Cited

U.S. PATENT DOCUMENTS 6,157,072 A * 12/2000 Nakayama et al. .......... 257/443
6,388,649 B1 * 5/2002 Tanaka ..................... G09G 3/36
345/89

(Continued)

FOREIGN PATENT DOCUMENTS

CN 101645454 2/2010
JP 2006-100797 4/2006

OTHER PUBLICATIONS

Chinese Office Action issued Aug. 5, 2014 in corresponding Chinese Application No. 201110035906.3.
Japanese Office Action issued Sep. 16, 2014 in corresponding Japanese Application No. 2011005620.

*Primary Examiner* — Bryan Bui
(74) *Attorney, Agent, or Firm* — Chip Law Group

(57) ABSTRACT

A method of detecting a change in current is provided which includes irradiating light on at least one photoelectric conversion material layer, and detecting an increased change in current generated in the photoelectric conversion material layer. A photoelectric conversion apparatus is also provided and includes a photoelectric conversion element including a photoelectric conversion material layer, and a current detection circuit electrically connected to the photoelectric conversion element. In the photoelectric conversion apparatus, the current detection circuit detects an increased change in current generated in the photoelectric conversion material layer.

25 Claims, 10 Drawing Sheets

(51) Int. Cl.
  *H01L 27/146*  (2006.01)
  *H01L 27/30*  (2006.01)
  *H01L 31/032*  (2006.01)
  *H01L 31/0352*  (2006.01)
  *H01L 51/00*  (2006.01)
  *H01L 51/42*  (2006.01)
  *H01L 31/0256*  (2006.01)

(52) U.S. Cl.
  CPC .......... *H01L 27/307* (2013.01); *H01L 31/032* (2013.01); *H01L 31/035218* (2013.01); *H01L 31/09* (2013.01); *H01L 51/0072* (2013.01); *H01L 51/0078* (2013.01); *H01L 51/0081* (2013.01); *H01L 51/0092* (2013.01); *H01L 51/4206* (2013.01); *H01L 2031/0344* (2013.01)

(58) Field of Classification Search
  USPC ............. 702/64; 257/40, 431, 443, E51.012, 257/E31.11; 324/76.11
  See application file for complete search history.

(56) References Cited

U.S. PATENT DOCUMENTS

| | | | | |
|---|---|---|---|---|
| 7,400,023 | B2* | 7/2008 | Watanabe et al. | 257/448 |
| 8,212,201 | B2* | 7/2012 | Murata | 250/214.1 |
| 2001/0000335 | A1* | 4/2001 | Yamada | H01L 31/1804 438/1 |
| 2004/0056648 | A1* | 3/2004 | Matsuyama | H02S 50/10 324/96 |
| 2004/0165102 | A1* | 8/2004 | Komatsu | H04N 1/195 348/370 |
| 2008/0096291 | A1* | 4/2008 | Takai | C23C 16/24 438/7 |
| 2009/0084938 | A1* | 4/2009 | Okada | H01L 27/14676 250/208.1 |
| 2009/0236504 | A1* | 9/2009 | Yamaguchi | G09G 3/3406 250/214.1 |
| 2010/0032548 | A1* | 2/2010 | Murata | 250/206 |
| 2011/0132438 | A1* | 6/2011 | Pasanen et al. | 136/252 |

* cited by examiner

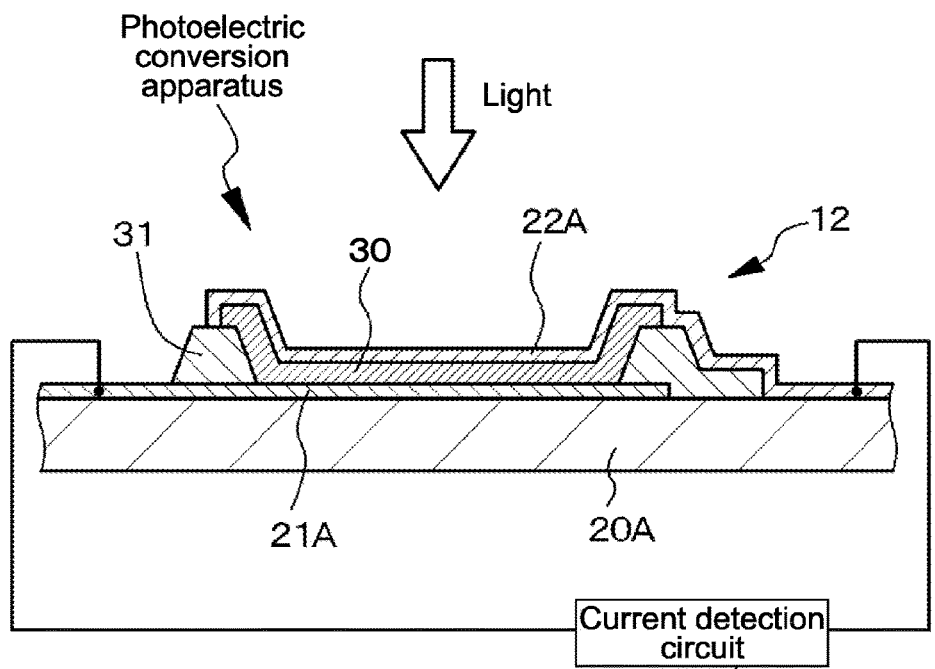
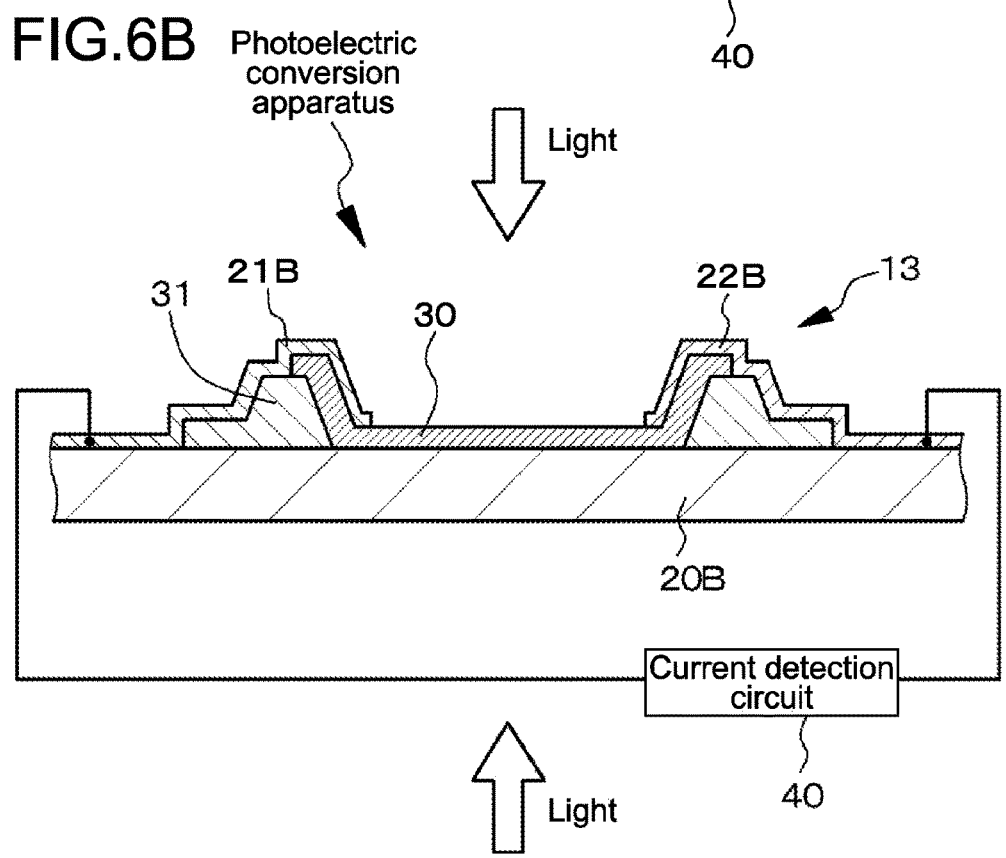

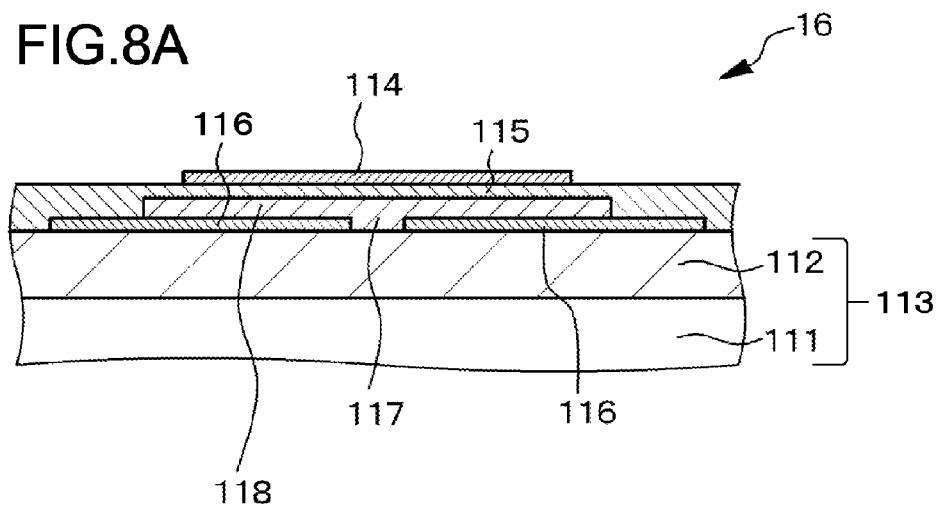
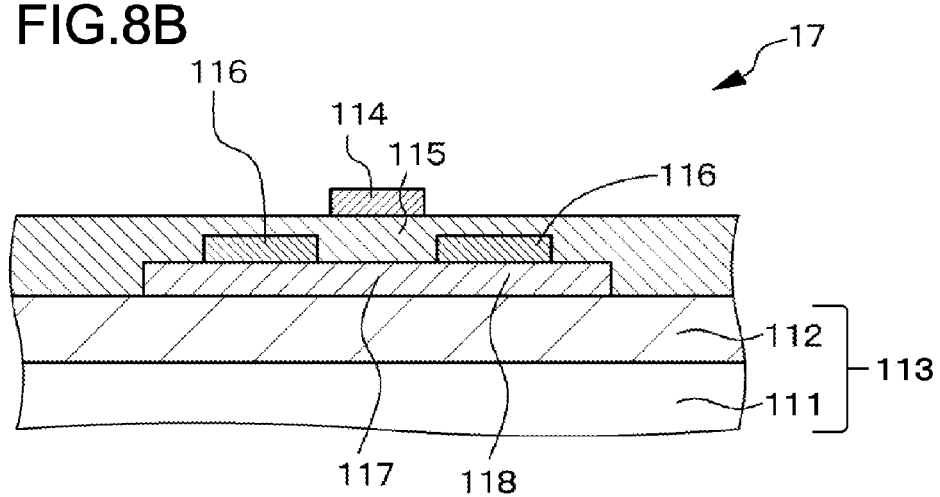

PHOTOELECTRIC CONVERSION ELEMENT, PHOTOELECTRIC CONVERSION APPARATUS AND SOLID-STATE IMAGING APPARATUS

CROSS REFERENCES TO RELATED APPLICATIONS

The present application is a continuation-in-part of U.S. patent application Ser. No. 12/510,392 filed on Jul. 28, 2009, now U.S. Pat. No. 8,212,201, which claims priority to and claims benefit from Japanese Patent Applications JP 2008-202296 filed in the Japan Patent Office on Aug. 5, 2008, Japanese Patent Application JP 2010-032179 filed in the Japan Patent Office on Feb. 17, 2010 and Japanese Patent Application JP 2011-005620 filed in the Japan Patent Office on Jan. 14, 2011, respectively, the entire contents of which are hereby incorporated by reference.

BACKGROUND

The present disclosure relates to a photoelectric conversion element, a photoelectric conversion apparatus having the photoelectric conversion element, and a solid-state imaging apparatus having the incorporated photoelectric conversion apparatus.

Photoelectric conversion elements such as image sensors normally have a structure in which a photoelectric conversion unit is held between two electrodes. The output from a photoelectric conversion element (e.g., electric current), which is not dependent on time, is detected as steady output (steady current). This is because semiconductor materials for example of silicon (Si) accumulate carriers instantaneously and give steady current under the electric field at the intensity generally used.

Image sensors having a photoelectric conversion unit made of an organic semiconductor material are known, for example as disclosed in Japanese Patent Application Laid-open No. 2006-100797 (hereinafter, referred to as Patent Document 1). Such an image sensor has an organic photoelectric conversion layer held between at least two electrodes, and the organic photoelectric conversion layer contains a quinacridone or quinazoline derivative.

SUMMARY

In the technology disclosed in Patent Document 1 above, a signal is read out by using a common color read-out circuit (see paragraph number [0135]). Thus, in the image sensor disclosed in Patent Document 1, the signal outputted and read out from the photoelectric conversion element is considered to be part of an output signal in the steady state that is not dependent on time. However, detection of the part of an output signal in the steady state causes a problem that the sensitivity and the S/N ratio are lower.

Thus, there is a need for a new photoelectric conversion element having a photoelectric conversion material layer with high sensitivity and high S/N ratio, a photoelectric conversion apparatus having such a photoelectric conversion element incorporated, and a solid-state imaging apparatus having such a photoelectric conversion apparatus incorporated.

Photoelectric conversion elements produced by using a Si-based semiconductor material for its photoelectric conversion material layer generally have very low electrical resistance. In contrast, for example, thin films of metal oxide or organic material are generally higher in resistance and lower in carrier mobility than Si-based semiconductor materials, independently of their crystallinity. Specifically, thin films of metal oxide material or organic material have low carrier mobility, high resistance, and additionally many defect levels, and it is very difficult to inject carriers to an amount that fills the capacity of the thin layer instantaneously even under very high-intensity electric field. Therefore, such a film demands a certain period of time for stabilization of the electric potential distribution in the thin film including formation of an interfacial electrical double layer. Thus, although electric charges accumulate in the photoelectric conversion material layer, when light is irradiated to the photoelectric conversion material layer while voltage is applied to the photoelectric conversion material layer, it is possible to observe the transient charge/discharge current generated in the photoelectric conversion material layer because the time constant $\tau$ of the photoelectric conversion material layer is sufficiently large (in the order of several microseconds to several milliseconds).

In an embodiment, a method of detecting a change in current includes irradiating light on at least one photoelectric conversion material layer. The method also includes detecting an increased change in current generated in the photoelectric conversion material layer. In an embodiment, the method includes detecting a current $I_{inc}$ in a current increasing period according to the following formula (I):

$$I_{inc} = C_1 * I_o(P) * [1 - e^{(-t/\tau(P))}] + C_2 \qquad (1)$$

In formula (1), $\tau(P)$ represents a time constant of the changes in the current in the current increasing period from a first time to a second time, t represents an elapsed time from the first time to the second time, $I_0(P)$ represents a current generated in the photoelectric conversion material layer when light at an intensity P is irradiated on the photoelectric conversion material layer when $t=\infty$, and $C_1$ and $C_2$ represent constants. In an embodiment, the second time occurs at or before a time of transition from the current increasing period to a current decreasing period. In an embodiment, the method further includes calculating the integral current value by integrating formula (1) from t=0 to about t=100 milliseconds. In an embodiment, the photoelectric conversion material layer is formed between a first electrode and a second electrode, and the method further includes: detecting changes in the current generated in the photoelectric conversion material layer from a first time corresponding with (a) an initiation of irradiation of light on the photoelectric conversion material layer, or (b) an initiation of voltage application to the first electrode and the second electrode, to a second time occurring after the first time. In an embodiment, the changes in current in the photoelectric conversion material layer from the first time to the second time correspond to changes in charge current in a capacitor defined by the first electrode, the second electrode, and the photoelectric conversion material layer. In an embodiment, the method further includes detecting a time constant of the changes in the current in a current increasing period from the first time to the second time as $\tau(P)$, wherein $\tau(P)$ is a function of a light intensity P per unit time of the irradiation of the light on the photoelectric conversion material layer. In an embodiment, the photoelectric conversion material layer includes at least one organic semiconducting material selected from the group consisting of organic colorants represented by quinacridone and the derivatives thereof, colorants of an early transition metal ion chelated by an organic material represented by Alq3 [tris(8-quinolinolato)aluminum(III)], and organic metal colorants having a complex formed between a transition metal ion and an organic material represented by phthalocyanine zinc (II). In an embodiment, the photoelectric conversion material includes at least one material selected from the group consisting of organic metal compounds, organic semiconductor fine particles, metal oxide semiconductors, inorganic semiconductor fine particles, core-shell materials, and organic/inorganic hybrid compounds. In an embodiment, the photoelectric conversion material is formed as a photoelectric conversion material layer having a carrier mobility of less than or equal to 10 $cm^2/V*second$.

In another embodiment, a photoelectric conversion element includes at least one photoelectric conversion material layer configured to enable a detection of an increased change in current generated in said photoelectric conversion material layer. In an embodiment, the photoelectric conversion element further includes a first electrode and a second electrode, the photoelectric conversion material layer being disposed between the first electrode and the second electrode. In an embodiment, the first electrode is comprised of a transparent conductive material and is formed on a transparent substrate, the photoelectric conversion material layer is formed on the first electrode, and the second electrode is formed on the photoelectric conversion material layer. In an embodiment, the first electrode is formed on a substrate, the photoelectric conversion material layer is formed on the first electrode, and the second electrode is comprised of a transparent conductive material and is formed on the photoelectric conversion material layer. In an embodiment, the first electrode and the second electrodes are formed on a substrate, and the photoelectric conversion material layer is formed on the substrate in a region between the first electrode and the second electrode. In an embodiment, the photoelectric conversion material layer is configured to enable a detection of current $I_{inc}$ in a current increasing period according to the following formula (1):

$$I_{inc}=C_1*I_o(P)*[1-e^{(-t/\tau(P))}]+C_2 \quad (1)$$

In formula (1), $\tau(P)$ represents a time constant of the changes in the current in the current increasing period from a first time to a second time, t represents an elapsed time from the first time to the second time, $I_0(P)$ represents a current generated in the photoelectric conversion material layer when light at an intensity P is irradiated on the photoelectric conversion material when t=∞, and $C_1$ and $C_2$ represent constants. In an embodiment, the second time occurs at or before a time of transition from the current increasing period to a current decreasing period. In an embodiment, the photoelectric conversion element further includes calculating the integral current value by integrating formula (1) from t=0 to about t=100 milliseconds. In an embodiment, the photoelectric conversion material layer is configured to enable a detection of the current generated in the photoelectric conversion material layer from a first time corresponding with (a) an initiation of irradiation of light on the photoelectric conversion material layer, or (b) an initiation of voltage application to the photoelectric conversion material layer, to a second time occurring after the first time. In an embodiment, the photoelectric conversion material layer is configured to enable a detection of a time constant of the changes in the current in a current increasing period from the first time to the second time as $\tau(P)$, and $\tau(P)$ is a function of a light intensity P per unit time of the irradiation of the light on the photoelectric conversion material layer. In an embodiment, the photoelectric conversion material layer includes at least one organic semiconducting material selected from the group consisting of organic colorants represented by quinacridone and the derivatives thereof, colorants of an early transition metal ion chelated by an organic material represented by Alq3 [tris(8-quinolinolato) aluminum(III)], and organic metal colorants having a complex formed between a transition metal ion and an organic material represented by phthalocyanine zinc (II). In an embodiment, the photoelectric conversion material layer includes at least one material selected from the group consisting of organic metal compounds, organic semiconductor fine particles, metal oxide semiconductors, inorganic semiconductor fine particles, core-shell materials, and organic/inorganic hybrid compounds. In an embodiment, the photoelectric conversion material layer has a carrier mobility less than or equal to 10 $cm^2/V*second$.

In another embodiment, a photoelectric conversion apparatus includes a photoelectric conversion element including at least one photoelectric conversion material layer, and a current detection circuit electrically connected to the photoelectric conversion element. In this embodiment, the current detection circuit detects an increased change in current generated in the photoelectric conversion material layer.

In another embodiment, a solid state imaging apparatus includes an imaging region including at least one photoelectric conversion element having at least one photoelectric conversion material layer, and a current detection circuit electrically connected to at least one of the photoelectric conversion elements. In this embodiment, the current detection circuit detects an increased change in current generated in the photoelectric conversion material layer. In an embodiment, the imaging region includes a plurality of photoelectric conversion elements arranged in an array, and each of the photoelectric conversion elements includes a first electrode, a second electrode, and a photoelectric conversion material layer disposed between the first electrode and the second electrode. In an embodiment, the solid state imaging apparatus further includes a plurality of current detection circuits, wherein each of the photoelectric conversion elements is connected to a different one of the plurality of current detection circuits. In an embodiment, the array is a two-dimensional array including rows and columns, and the current detection circuit is formed for a row or a column of photoelectric conversion elements.

In the photoelectric conversion element according to an embodiment, the photoelectric conversion element constituting the photoelectric conversion apparatus according to an embodiment, and the photoelectric conversion element constituting the solid-state imaging apparatus according to an embodiment (hereinafter, these are collectively referred to as the "photoelectric conversion element and others according to an embodiment"), when light at a particular light intensity is irradiated to the photoelectric conversion material layer while voltage is applied between the first and second electrodes (i.e., while bias voltage is applied between the first and second electrodes), the electric current generated in the photoelectric conversion material layer increases with elapse of the irradiation time from initiation of irradiation. It is thus possible to provide a high-sensitivity and high-S/N ratio photoelectric conversion element or the like by detecting such electric current. In other words, it is possible to determine the intensity of the light received based on the charge current. In particular, it is possible to detect transient response within a very short period of about 5 milliseconds or less even when light at very strong light intensity, which may saturate known photodiodes, is irradiated, and thus, it is possible to detect the light at light intensity that may saturate known photodiodes. It is thus possible to expand the dynamic range when it is used as a solid-state imaging apparatus. As for the current-time response and the dependence on light intensity when light is irradiated to the photoelectric conversion material layer, the electric current area of charge current (time integral value of current) is dependent on light intensity.

Additional features and advantages are described herein, and will be apparent from the following Detailed Description and the figures.

BRIEF DESCRIPTION OF THE FIGURES

FIGS. 6A and 6B are partial schematic cross-sectional views respectively illustrating photoelectric conversion elements in a two-terminal electronic device structure of Examples 3 and 4;

FIGS. 8A and 8B are partial schematic cross-sectional views respectively illustrating photoelectric conversion elements in a three-terminal electronic device structure of Examples 7 and 8;

DETAILED DESCRIPTION

Figure 1:
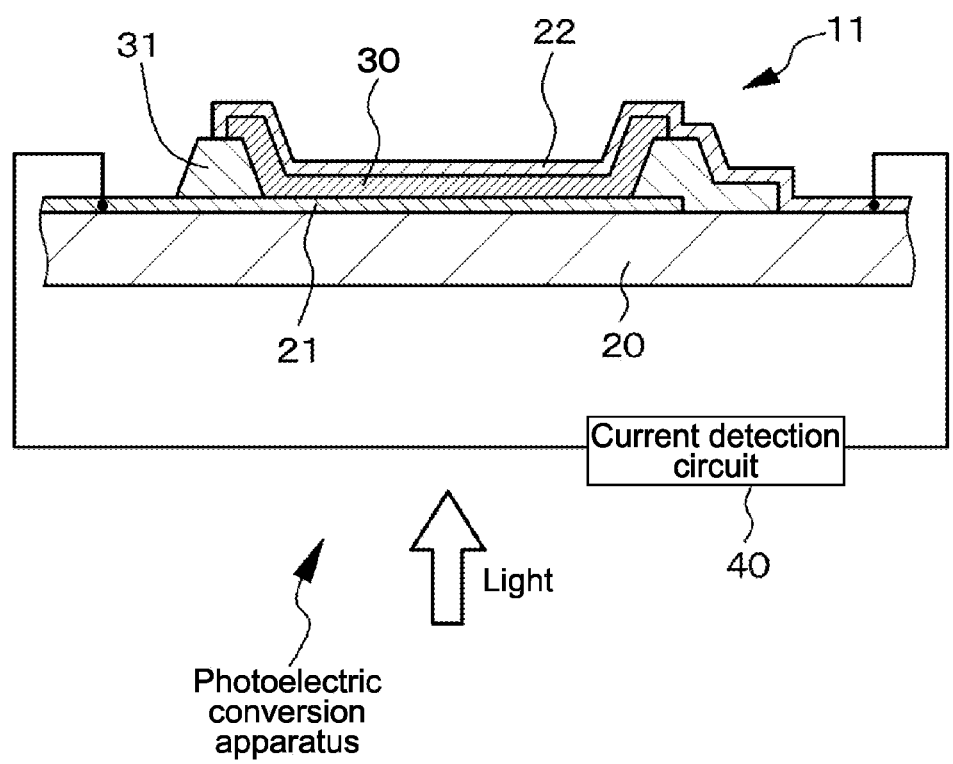
FIG. 1 is a schematic cross-sectional view illustrating a photoelectric conversion element of Example 1 in a two-terminal electronic device structure.

Hereinafter, an embodiment of will be described with reference to the drawings. The various numerical values and materials indicated in the embodiments are merely examples. The following items will be described in this order:

1. General description of the photoelectric conversion element, photoelectric conversion apparatus, and solid-state imaging apparatus according to an embodiment, 2. Example 1 (photoelectric conversion element and photoelectric conversion apparatus according to an embodiment and photoelectric conversion element in first configuration), 3. Example 2 (a variation of Example 1), 4. Example 3 (a variation of Example 1, photoelectric conversion element in second configuration), 5. Example 4 (another variation of Example 1, photoelectric conversion element in third configuration), 6. Example 5 (another variation of Example 1, three-terminal electronic device structure), 7. Example 6 (another variation of Example 1, three-terminal electronic device structure), 8. Example 7 (another variation of Example 1, three-terminal electronic device structure), 9. Example 8 (another variation of Example 1, three-terminal electronic device structure), and 10. Example 9 (solid-state imaging apparatus according to an embodiment) and others.

[General Description of Photoelectric Conversion Element, Photoelectric Conversion Apparatus, and Solid-State Imaging Apparatus According to an Embodiment]

In the photoelectric conversion element and others according to an embodiment, when a time constant of the change in electric current increasing with elapse of the irradiation time from its initiation is designated as τ(P), τ(P) may be expressed by a function of the light intensity P per unit time of the light irradiated to the photoelectric conversion material layer. Specifically, for example, a value [α(P)] having a unit of [−1/τ(P)] can be expressed by a linear function of the light intensity P per unit time of the light irradiated to the photoelectric conversion material layer. In the photoelectric conversion apparatus or the solid-state imaging apparatus according to an embodiment, it is possible to cause the current detection circuit to calculate τ(P). Specifically, it is possible to obtain the light intensity P per unit time of the light irradiated to the photoelectric conversion material layer, by calculating τ(P) in the current detection circuit.

In such a case, the current $I_{inc}$ generated in the photoelectric conversion material layer of the photoelectric conversion element and others according to an embodiment can be expressed, when the time elapsed from initiation of irradiation or application of voltage to the first and second electrodes is designated as t, by:

Iinc=C1·I0(P) [1−exp(−t/τ(P))]+C2(1) and, in the photoelectric conversion apparatus or the solid-state imaging apparatus according to an embodiment, it is possible to cause the current detection circuit to calculate $I_{inc}$, additionally. In the formula above, $I_0(P)$ is the electric current generated in the photoelectric conversion material layer when it is assumed that light at a certain light intensity P is irradiated to the photoelectric conversion material layer when t=∞, and $C_1$ and $C_2$ are constants. $C_1$ is a positive value.

In the photoelectric conversion apparatus or the solid-state imaging apparatus according to an embodiment, in the above case, the current detection circuit may additionally be configured to calculate the integral current value obtained by integrating the Formula (1) from t=0 up to t=100 milliseconds. Also in the photoelectric conversion element according to an embodiment, the integral current value (including physical quantities calculated based on the integral current value) obtained by integrating the Formula (1) from t=0 up to t=100 milliseconds may be caused to show dependence on light intensity.

In the photoelectric conversion apparatus, the solid-state imaging apparatus, or the photoelectric conversion element according to an embodiment, the increase of the current in the photoelectric conversion material layer with elapse of irradiation time may correspond to the change of the charge current in the capacitor, when it is assumed that the first electrode, the photoelectric conversion material layer, and the second electrode constitute a capacitor.

In addition, in the photoelectric conversion apparatuses, the solid-state imaging apparatuses, or the photoelectric conversion elements according to an embodiment, the photoelectric conversion material layer is desirably made of an organic material. In such a case, the photoelectric conversion material layer more desirably has a carrier mobility of 10 cm²/V·second or less.

In the photoelectric conversion elements and others according to an embodiment, the first electrode made of a transparent conductive material may be formed on a transparent substrate, the photoelectric conversion material layer on the first electrode, and the second electrode on the photoelectric conversion material layer. Such a configuration will be referred to, for convenience, as the "photoelectric conversion element in the first configuration". Alternatively, the first electrode may be formed on a substrate, the photoelectric conversion material layer on the first electrode, and the second electrode made of a transparent conductive material on the photoelectric conversion material layer. Such a configuration will be referred to, for convenience, as the "photoelectric conversion element in the second configuration". Alternatively, the first and second electrodes may be formed on a substrate, and the photoelectric conversion material layer on a region of the substrate from the first electrode to the second electrode. Such a configuration will be referred to, for convenience, as the "photoelectric conversion element in the third configuration".

In the photoelectric conversion elements and others according to an embodiment in the preferred embodiments and configurations including those described above, the photoelectric conversion material layer may be in an amorphous state or in a crystalline state. Moreover, the method for detecting changes in current can be applied to one photoelectric conversion material layer or multiple photoelectric conversion material layers. In the case where there are two or more photoelectric conversion material layers, the method includes separately detecting the increased changes in current generated in each of the photoelectric conversion material layers.

Examples of the organic materials constituting the photoelectric conversion material layer include organic semiconductor materials, more specifically, organic colorants represented by quinacridone and the derivatives thereof, colorants of an early transition metal (metal on the left side of periodic table) ion chelated by an organic material represented by Alq3 [tris(8-quinolinolato)aluminum(III)], and organic metal colorants having a complex formed between a transition metal ion and an organic material represented by phthalocyanine zinc (II), and dinaphtho-thieno-thiophene (DNTT) represented by the following structural formula:

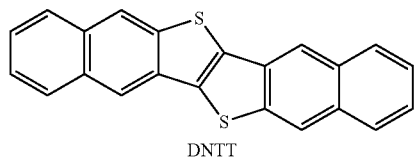

DNTT

Alternatively, examples of the materials constituting the photoelectric conversion material layer for use include organic metal compounds, organic semiconductor fine particles, metal oxide semiconductors, inorganic semiconductor fine particles, core-shell materials, and organic/inorganic hybrid compounds. Specific examples of the organic metal compounds include the above-described colorants of an early transition metal ions chelated by an organic material, and the organic metal colorants having a complex formed between a transition metal ion and an organic material.

Specific examples of the organic semiconductor fine particles include aggregates of the organic colorants described above represented by quinacridone and the derivatives thereof, aggregates of the colorants of an early transition metal ion chelated by an organic material, aggregates of organic metal colorants having a complex formed between a transition metal ion and an organic material, Prussian blue and the derivatives having metal ion crosslinked with cyano groups, and the mixtures of these aggregates.

Specific examples of the metal oxide semiconductors and the inorganic semiconductor fine particles include ITO, IGZO, ZnO, IZO, IrO₂, TiO₂, SnO₂, SiO$_x$, metal chalcogen semiconductors containing chalcogens [for example, sulfur (S), selenium (Se) or tellurium (Te)] (specifically, CdS, CdSe, ZnS, CdSe/CdS, CdSe/ZnS, PbSe), ZnO, CdTe, GaAs, and Si.

A range of an average particle diameter $R_{AVE}$ of the fine particles is not particularly limited, but is $5.0 \times 10^{-10}$ m $\leq R_{AVE} \leq 1.0 \times 10^{-6}$ m, desirably $5.0 \times 10^{-10}$ m $\leq R_{AVE} \leq 1 \times 10^{-8}$ m, and more desirably $5.0 \times 10^{-10}$ m $\leq R_{AVE} \leq 1.0 \times 10^{-7}$ m, and the fine particles are desirably highly dispersible in water or organic solvent. The absorption band of the fine particles is desirably located in the visible light range of 380 nm to 800 nm, the near-infrared range of 800 nm to 1500 nm, or the visible light region of 380 nm to 800 nm and the near-infrared range of 800 nm to 1500 nm. A shape of the fine particle may be spherical, but is not limited thereto, and the shape may be, for example, triangular, tetrahedral, cubic, rectangular, conical, cylindrical (rod), triangular prism, fibrous, pill-like fiber, or the like. When the fine particle has a non-spherical shape, the average particle diameter $R_{AVE}$ of the particle can be calculated, by determining the average diameter of a spherical particle having the volume identical with that of the fine particle. The average particle diameter $R_{AVE}$ of the fine particles can be obtained by measuring the particle diameter of the fine particles, for example, observed with transmission electron microscope (TEM).

Specific examples of the core-shell materials, i.e., combinations of (core material and shell material), include organic materials such as (polystyrene and polyaniline) and metal materials such as (hardly ionizable metal material and easily ionizable metal material).

Specific examples of the organic-inorganic hybrid compounds include Prussian blue and the derivatives thereof having metal ions crosslinked with cyano groups, and also coordination polymers, a generic term indicating those having metal ions completely crosslinked with bipyridine and those having metal ions crosslinked with a polyvalent ionic acid, represented by oxalic acid and rubeanic acid.

Examples of the methods of forming the photoelectric conversion material layer, which depend on the materials used, include coating methods, physical vapor deposition (PVD) methods, and various chemical vapor deposition (CVD) methods including MOCVD. Specific examples of the coating methods include spin coating method; immersion method; casting method; various printing methods such as screen printing, inkjet printing, offset printing, and gravure printing; stamping method; spraying method; and other various coating methods including air doctor coater method, blade coater method, rod coater method, knife coater method, squeeze coater method, reverse roll coater method, transfer roll coater method, gravure coater method, kiss coater method, cast coater method, spray coater method, slit orifice coater method, and calendering-coater method. Examples of the solvents used in the coating method include nonpolar or less polar organic solvents such as toluene, chloroform, hexane, and ethanol. Examples of the PVD methods include various vacuum deposition methods such as electron beam heating method, resistance heating method, and flash vapor deposition; plasma vapor deposition method; various sputtering methods such as bipolar sputtering method, direct current sputtering method, direct current magnetron sputtering method, high-frequency sputtering method, magnetron sputtering method, ion beam sputtering method, and bias sputtering method; and various ion plating methods such as DC (direct current) method, RF method, multi-cathode method, activation reaction method, electric field vapor deposition method, high-frequency ion plating method, and reactive ion plating method.

The thickness of the photoelectric conversion material layer is not particularly limited, but is, for example, $1 \times 10^{-10}$ m to $5 \times 10^{-7}$ m.

The voltage (bias voltage) applied between the first electrode and the second electrode is, for example, 1 millivolt to 15 volts, although it depends on the materials constituting the photoelectric conversion layer. The electric current generated in the photoelectric conversion material layer when light at a certain light intensity P is irradiated to the photoelectric conversion material layer increases with elapse of the irradiation time, and the irradiation time of the light at a certain light intensity P is, for example, $1 \times 10^{-12}$ second to $1 \times 10^{-1}$ second, although it depends on the material constituting the photoelectric conversion material layer. Although the electric current generated in the photoelectric conversion material layer increases with elapse of the irradiation time, the increase or the increase rate depends on the materials constituting the photoelectric conversion material layer and cannot be determined unambiguously. Thus, it may be determined after various tests.

The time constant $\tau(P)$ is expressed by a function of the light intensity P per unit time of the light irradiated to the photoelectric conversion material layer, but the function of light intensity P can be obtained after conducting various tests, and the function of light intensity P may be stored, for example, in the current detection circuit. Similarly, the relationship between the electric current $I_{inc}$ and the light intensity P per unit time of the light irradiated to the photoelectric conversion material layer can be obtained after various tests, and the relationship may also be stored, for example, in the current detection circuit. In a preferred configuration, the current detection circuit determines the integral current value for example by integrating Formula (1), but may determine the light intensity P based on the integral current value containing only the first member of Formula (1) (including physical quantities calculated based on the integral current value), or based on integral current value containing the first and second members of Formula (1) (including physical quantities calculated based on the integral current value), and the relationship between the integral current value (including physical quantities calculated based on the integral current value) and the light intensity P may also be stored, for example, in the current detection circuit. Alternatively, the light intensity P can be determined, based on the time t and the electric current $I_{inc}$ according to Formula (1).

The current detection circuit may be a current detection circuit in any known configuration or structure, if it can calculate $\tau(P)$ or determine $I_{inc}$ or light intensity P. Other constituents of the solid-state imaging apparatus may also be known constituents.

The first and second electrodes are separated from each other, for example as the second electrode is formed above the first electrode (photoelectric conversion element in the first or second configuration) or as the first and second electrodes are formed as they face each other on a substrate (photoelectric conversion element in the third configuration).

A structure of the photoelectric conversion element and others according to an embodiment is not limited to a two-terminal electronic device structure having the first and second electrodes, and may be a three-terminal electronic device structure additionally having a control electrode, in which the flow of electric current can be modulated by application of voltage to the control electrode. Specific examples of the three-terminal electronic device structures include the configurations and structures identical with those of so-called bottom gate/bottom contact-type, bottom gate/top contact-type, top gate/bottom contact-type, and top gate/top contact-type field effect transistors (FETs).

More specifically, the photoelectric conversion element or the like according to an embodiment in the bottom gate/bottom contact-type three-terminal electronic device structure has (a) a control electrode formed on a support (equivalent to gate electrode), (b) an insulation layer formed on the control electrode and the support (equivalent to gate insulation layer), (c) first and second electrodes formed on the insulation layer (equivalent to source and drain electrodes), and (d) a photoelectric conversion material layer formed on the insulation layer between the first and second electrodes (equivalent to channel forming region).

The photoelectric conversion element or the like according to an embodiment in the bottom gate/top contact-type three-terminal electronic device structure has (a) a control electrode formed on a support (equivalent to gate electrode), (b) an insulation layer formed on the control electrode and the support (equivalent to gate insulation layer), (c) a photoelectric conversion material layer (equivalent to channel forming region) and the peripheral region of the photoelectric conversion material layer formed on the insulation layer, and (d) first and second electrodes formed on the peripheral region of the photoelectric conversion material layer (equivalent to source and drain electrodes).

Alternatively, the photoelectric conversion element or the like according to an embodiment in the top gate/bottom contact-type three-terminal electronic device structure has (a) first and second electrodes formed on a support (equivalent to source and drain electrodes), (b) a photoelectric conversion material layer formed on the support between the first and second electrodes (equivalent to channel forming region), (c) an insulation layer formed on the first and second electrodes and the photoelectric conversion material layer (equivalent to gate insulation layer), and (d) a control electrode formed on the insulation layer (equivalent to gate electrode).

Alternatively, the photoelectric conversion element or the like according to an embodiment in the top gate/top contact-type three-terminal electronic device structure includes (a) a photoelectric conversion material layer (equivalent to channel forming region) and the peripheral region of the photoelectric conversion material layer formed on a substrate, (b) first and second electrodes formed on the peripheral region of the photoelectric conversion material layer (equivalent to source and drain electrodes), (c) an insulation layer formed on the first and second electrodes and the photoelectric conversion material layer (equivalent to gate insulation layer), and (d) a control electrode formed on the insulation layer (equivalent to gate electrode).

Examples of the transparent conductive materials constituting the first or second electrode include indium tin oxides (including ITO, Sn-doped $In_2O_3$, crystalline ITO, and amorphous ITO), IFO (F-doped $In_2O_3$), tin oxide ($SnO_2$), ATO (Sb-doped $SnO_2$), FTO (F-doped $SnO_2$), zinc oxides (including Al-doped ZnO, B-doped ZnO, and Ga-doped ZnO), indium oxide-zinc oxide (IZO), titanium oxide ($TiO_2$), spinel oxides, and oxides having the $YbFe_2O_4$ structure. The first or second electrode made of one of these materials normally has high work function and functions as an anode electrode. Examples of the methods of forming the transparent electrode include PVD methods such as vacuum deposition method, reactive vapor deposition method, various sputtering method, electron beam vapor deposition method, and ion plating method; various CVD methods such as pyrosol method, organic metal compound-pyrolyzing method, spraying method, dipping method, and MOCVD method; and electroless and electrolytic plating methods, although the method depends on the materials constituting the transparent electrode.

The conductive material constituting the first or second electrode, which is used when transparency is not required, is desirably a conductive material having high work function (for example, $\phi=4.5$ eV to 5.5 eV), if the first electrode or second electrode is used as the anode electrode (positive electrode), i.e., as an electrode for withdrawing positive holes, and specific examples thereof include gold (Au), silver (Ag), chromium (Cr), nickel (Ni), palladium (Pd), platinum (Pt), iron (Fe), iridium (Ir), germanium (Ge), osmium (Os), rhenium (Re), and tellurium (Te). On the other hand, when the first or second electrode is used as the cathode electrode (negative electrode), i.e., as an electrode for withdrawing electrons, it is desirably a conductive material having low work function (for example, $\phi=3.5$ eV to 4.5 eV), and specific examples thereof include alkali metals (such as Li, Na, and K) and the fluorides or oxides thereof, alkali-earth metals (such as Mg and Ca) and the fluorides or oxides thereof, aluminum (Al), zinc (Zn), tin (Sn), thallium (Tl), sodium/potassium alloys, aluminum/lithium alloys, magnesium/silver alloys, rare earth metals such as indium and ytterbium, and the alloys thereof.

Alternatively, examples of the materials constituting the first, second, or control electrode include metals such as platinum (Pt), gold (Au), palladium (Pd), chromium (Cr), nickel (Ni), aluminum (Al), silver (Ag), tantalum (Ta), tungsten (W), copper (Cu), titanium (Ti), indium (In), tin (Sn), iron (Fe), cobalt (Co), and molybdenum (Mo); alloys containing these metal elements, conductive particles of these metals, conductive particles of the alloys containing these metals, polysilicons containing impurities, conductive substances such as carbonic materials, oxide semiconductors, carbon nanotubes, and graphenes, and the electrode may have a laminated structure having the layers containing these elements. Other examples of the materials constituting the first, second, or control electrode include organic materials (conductive polymers) such as poly (3,4-ethylenedioxythiophene)/polystyrenesulfonic acid [pEDOT/PSS].

Examples of the methods of forming the first, second or control electrode include various PVD methods described above; various CVD methods including MOCVD method; various coating methods described above; lift-off method; sol-gel method; electrodeposition method; shadow mask method; plating methods such as electrolytic plating method, electroless plating method, or the combination thereof; and spraying methods, and the combinations as needed with patterning technology, although the method depends on the materials constituting the electrode.

Examples of the substrate or the support (hereinafter, referred to collectively as substrate or the like) include organic polymers (flexible polymeric materials in the shape of plastic film, sheet, plate or the like) such as polymethyl methacrylate (PMMA), polyvinylalcohol (PVA), polyvinylphenol (PVP), polyether sulfone (PES), polyimide, polycarbonate (PC), polyethylene terephthalate (PET), and polyethylene naphthalate (PEN), as well as mica. Such a substrate or the like of the flexible polymeric material, if used, allows incorporation or integration thereof in electronic devices for example having a curved surface shape. Other examples of the substrates or the like include various glass substrates, various glass substrates with surface insulation film formed thereon, quartz substrates, quartz substrates having surface insulation film formed thereon, silicon substrates having surface insulation film formed thereon, and metal substrates made of various alloys and various metals such as stainless steel. Examples of the insulation films include silicon oxide-based materials (for example, $SiO_x$ and spin-on glass (SOG)); silicon nitride ($SiN_y$); silicon oxide nitride (SiON); aluminum oxide ($Al_2O_3$); metal oxides, and metal salts. Alternatively, a conductive substrate having one of these insulation films formed on the surface (substrate of a metal such as gold or aluminum or a substrate of highly oriented graphite) may also be used. The surface of the substrate or the like is desirably smooth, but may have a roughness that does not exert adverse effects on the properties of the photoelectric conversion material layer. It may be possible to improve the adhesiveness between the first, second or control electrode with the substrate or the like by forming a silanol derivative by silane coupling method, a thin film of a thiol derivative, carboxylic acid derivative, phosphoric acid derivative or other derivatives by SAM method or the like, or a thin film of an insulating metal salt or metal complex, for example, by CVD method on the surface of the substrate or the like. The transparent substrate is a substrate made of a material that does not excessively absorb the light entering the photoelectric conversion material layer through the substrate.

The electrode or the photoelectric conversion material layer may be coated with a coating layer, as needed. Examples of the materials for the coating layer include silicon oxide-based materials; silicon nitride ($SiN_y$); inorganic insulating materials such as highly dielectric insulation films of a metal oxide such as aluminum oxide ($Al_2O_3$); polymethyl methacrylate (PMMA); polyvinylphenol (PVP); polyvinylalcohol (PVA); polyimides; polycarbonates (PC); polyethylene terephthalate (PET); polystyrene; silanol derivatives (silane-coupling agents) such as N-2 (aminoethyl)-3-aminopropyltrimethoxysilane (AEAPTMS), 3-mercaptopropyltrimethoxysilane (MPTMS), and octadecyltrichlorosilane (OTS); and organic insulating materials (organic polymers) such as straight-chain hydrocarbons having functional groups that can bind to the control electrode at one terminal such as octadecanethiol and dodecyl isocyanate. These compounds can be used in combination. Examples of the silicon oxide-based materials include silicon oxide ($SiO_x$), BPSG, PSG, BSG, AsSG, PbSG, silicon oxide nitride (SiON), SOG (spin-on glass), and low-dielectric constant materials (such as polyarylether, cycloperfluorocarbon polymers, and benzocyclobutene, cyclic fluoroplastics, polytetrafluoroethylene, arylether fluoride, polyimide fluoride, amorphous carbon, and organic SOG).

Examples of the materials for the insulation layer include inorganic insulating materials including silicon oxide-based materials, silicon nitride ($SiN_y$), and highly dielectric insulation films of a metal oxide such as aluminum oxide ($Al_2O_3$); and also polymethyl methacrylate (PMMA); polyvinylphenol (PVP); polyvinylalcohol (PVA); polyimides; polycarbonate (PC); polyethylene terephthalate (PET); polystyrene; silanol derivatives (silane-coupling agents) such as N-2 (aminoethyl)-3-aminopropyltrimethoxysilane (AE-APTMS), 3-mercaptopropyltrimethoxysilane (MPTMS), and octadecyltrichlorosilane (OTS); and organic insulating materials (organic polymers) such as straight-chain hydrocarbons having functional groups that can bind to the control electrode at one terminal such as octadecanethiol and dodecyl isocyanate. These compounds may be used in combination. Examples of the silicon oxide-based materials include silicon oxide ($SiO_x$), BPSG, PSG, BSG, AsSG, PbSG, silicon oxide nitride (SiON), SOG (spin-on glass), and low dielectric materials (such as polyarylether, cycloperfluorocarbon polymers, and benzocyclobutene, cyclic fluoroplastics, polytetrafluoroethylene, arylether fluoride, polyimide fluoride, amorphous carbon, and organic SOG).

Examples of the methods of forming the insulation layer include various PVD method described above; various CVD methods; spin coating method; various coating methods described above; sol-gel method; electrodeposition method; shadow mask method; and spraying method. Alternatively, the insulation layer can be formed by oxidation or nitridation of the surface of the control electrode or by forming an oxide or nitride layer on the surface of the control electrode. The methods of oxidizing the surface of the control electrode include, for example, an oxidation method using $O_2$ plasma and an anodic oxidation method, although the suitable method depends on the materials constituting the control electrode. The method of nitriding the surface of the control electrode is, for example, a nitriding method using $N_2$ plasma, although the suitable method depends on the materials constituting the control electrode. Alternatively, for example in the case of Au electrode, it is possible to form an insulation layer on the surface of the control electrode, by coating the control electrode surface with an insulating molecule having functional groups chemically binding to the control electrode, such as a straight-chain hydrocarbon having a terminal modified with a mercapto group, by a method such as immersion method in a self organization manner. Yet alternatively, it is possible to form the insulation layer by modifying the surface of the control electrode with a silanol derivative (silane-coupling agent).

It is possible, with the photoelectric conversion apparatus, or the photoelectric conversion element or the like according to an embodiment, to provide optical sensors and image sensors in addition to imaging apparatus (solid-state imaging apparatus) such as televisions and cameras.

Example 1

Example 1 relates to a photoelectric conversion apparatus and a photoelectric conversion element according to an embodiment and, more specifically, the photoelectric conversion element of Example 1 is a photoelectric conversion element in the first configuration. As shown in the schematic cross-sectional view of FIG. 1, a photoelectric conversion element 11 of Example 1 has (A) a first electrode 21 and a second electrode 22 formed separately, and (B) a photoelectric conversion material layer 30 formed between the first electrode 21 and the second electrode 22. The photoelectric conversion apparatus of Example 1 has the photoelectric conversion element 11 and additionally a current detection circuit 40.

In the photoelectric conversion element 11 of Example 1, the photoelectric conversion apparatus of Example 1, or the photoelectric conversion element 11 constituting the solid-state imaging apparatus described below, the electric current generated in the photoelectric conversion material layer 30, when light at a certain light intensity P is irradiated to the photoelectric conversion material layer 30 while voltage is applied between the first electrode 21 and the second electrode 22, increases with elapse of the irradiation time from initiation of irradiation. In addition, in the photoelectric conversion apparatus of Example 1 or the solid-state imaging apparatus described below, the current detection circuit 40 detects the electric current (or change in electric current). The current detection circuit 40 is connected to the first electrode 21 and the second electrode 22 and applies voltage between the first electrode 21 and the second electrode 22.

In the photoelectric conversion element 11 of Example 1, the first electrode 21 made of a transparent conductive material is formed on a transparent substrate 20, the photoelectric conversion material layer 30 on the first electrode 21, and the second electrode 22 on the photoelectric conversion material layer 30. Light then enters the photoelectric conversion material layer 30 through the substrate 20 and the first electrode 21.

The substrate 20 is a glass plate having a thickness of 0.7 mm; the first electrode 21 is made of a transparent conductive material (specifically, ITO having a thickness of 120 nm); the second electrode 22 is made of an aluminum (Al) material having a thickness 100 nm; and the photoelectric conversion material layer 30 is made of an organic material, specifically, an organic semiconductor material (more specifically, a quinacridone layer having a thickness of 50 nm). The photoelectric conversion material layer 30 has a carrier mobility of 10 $cm^2/V \cdot second$ or less (for example, about $10^{-3}$ $cm^2/V \cdot second$ to $10^{-6}$ $cm^2/V \cdot second$).

The photoelectric conversion element 11 of Example 1 can be prepared by the following method: First, the first electrode 21, an ITO layer having a thickness of 120 nm, is formed on the substrate 20 by lithography using a photomask. Then, protrusions 31 of an insulating material are formed on the substrate 20 and the first electrode 21, and a photoelectric conversion material layer 30 of quinacridone having a thickness of 50 nm is formed over the first electrode 21 and the protrusion 31 by vacuum deposition method. A second electrode 22 of aluminum having a thickness of 100 nm is then formed over the photoelectric conversion material layer 30 and the substrate 20 by a PVD method of using a metal mask. The protrusion 31 is formed as it surrounds the region of the substrate 20 where the photoelectric conversion material layer 30 is to be formed.

Light at a wavelength of 565 nm was irradiated at a certain light intensity P to the photoelectric conversion material layer 30 in the photoelectric conversion element 11 of Example 1 thus obtained, through the transparent substrate 20 and the first electrode 21. A voltage of 15 volts is applied to the first electrode 21, while the second electrode 22 is grounded. The electric current generated then in the photoelectric conversion material layer 30 increased with elapse of the irradiation time. The increase of the electric current generated in the photoelectric conversion material layer 30 with elapse of irradiation time in the photoelectric conversion element 11 corresponds to the change of the charge current in the capacitor, when it is assumed that the first electrode 21, the photoelectric conversion material layer 30, and the second electrode 22 form a capacitor. In other words, charge current was generated in the photoelectric conversion element 11. When the time constant of the change in electric current increasing with elapse of the irradiation time from initiation of irradiation is designated as τ(P), τ(P) is expressed by a function of the light intensity P of the light irradiated to the photoelectric conversion material layer 30 per unit time. The current detection circuit 40 calculates τ(P). When the elapsed time from initiation of irradiation or from initiation of voltage application to the first electrode 21 and the second electrode 22 is designated by t, the electric current $I_{inc}$ generated in the photoelectric conversion material layer 30 is expressed by:

$$I_{inc}=C_1*I_0(P)*[1-\exp(-t/\tau(P))]+C_2 \qquad (1)$$

Here, when the photoelectric conversion element 11 or the photoelectric conversion apparatus has means for controlling the light irradiated to the photoelectric conversion material layer 30 (for example, shutter), t may be set as the elapsed time from initiation of irradiation, while, when it has no means for controlling the light irradiated to the photoelectric conversion material layer 30, t may be set as the elapsed time from initiation of voltage application to the first electrode 21 and the second electrode 22 (initiation of application of bias voltage). "$I_0(P)$" is the electric current generated in the photoelectric conversion material layer 30, when it is postulated that light at a certain light intensity P is irradiated to the photoelectric conversion material layer 30 when t=∞, and $C_1$ and $C_2$ are constants. $C_1$ is a positive value, and, for example, $C_1=1$. In the photoelectric conversion apparatus or the solid-state imaging apparatus described below, $I_{inc}$ is additionally determined by the current detection circuit 40. Specifically, the charge current is detected by a known current detection circuit 40 connected to the first electrode 21 and the second electrode 22. In the photoelectric conversion apparatus, the current detection circuit 40 may determine the integral current value (in Example 1, electric charge quantity, a physical quantity calculated based on integral current value), by integrating the Formula (1), for example, from t=0 up to t=100 milliseconds. In the photoelectric conversion element 11, the integral current value (in Example 1, electric charge quantity, a physical quantity calculated based on integral current value) obtained by integrating the Formula (1), for example, from t=0 up to t=100 milliseconds shows dependence on light intensity.

Figure 2:
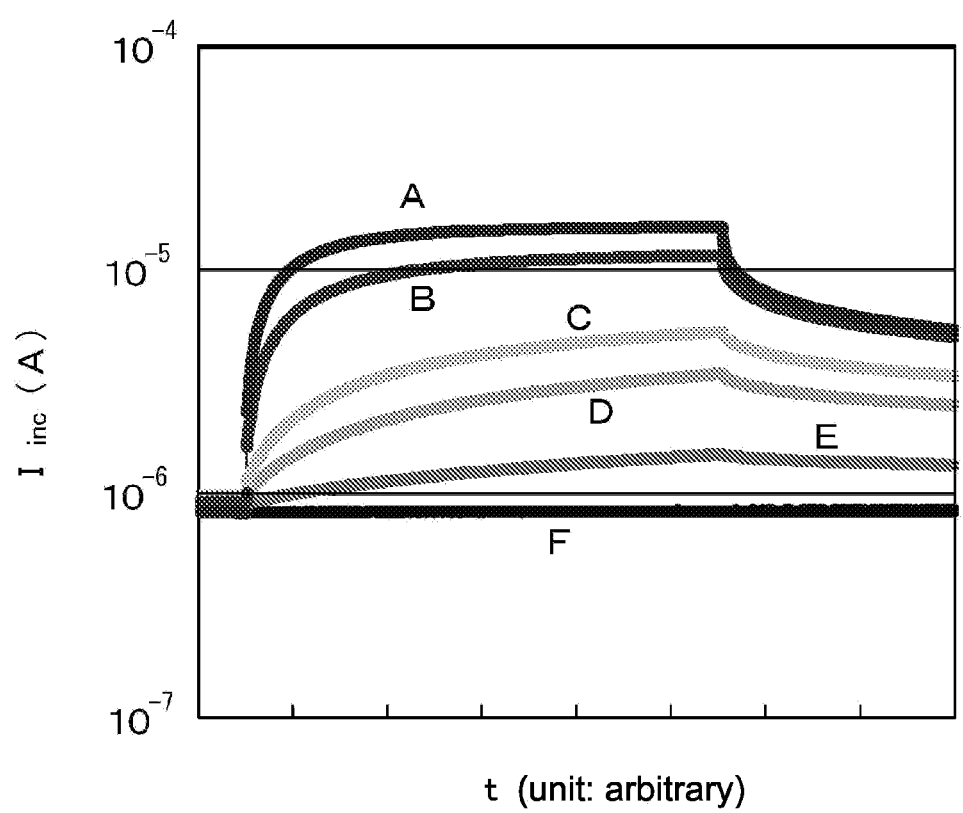
FIG. 2 is a graph showing a relationship between the charge current value and the light intensity in the photoelectric conversion element of Example 1.
Figure 3:
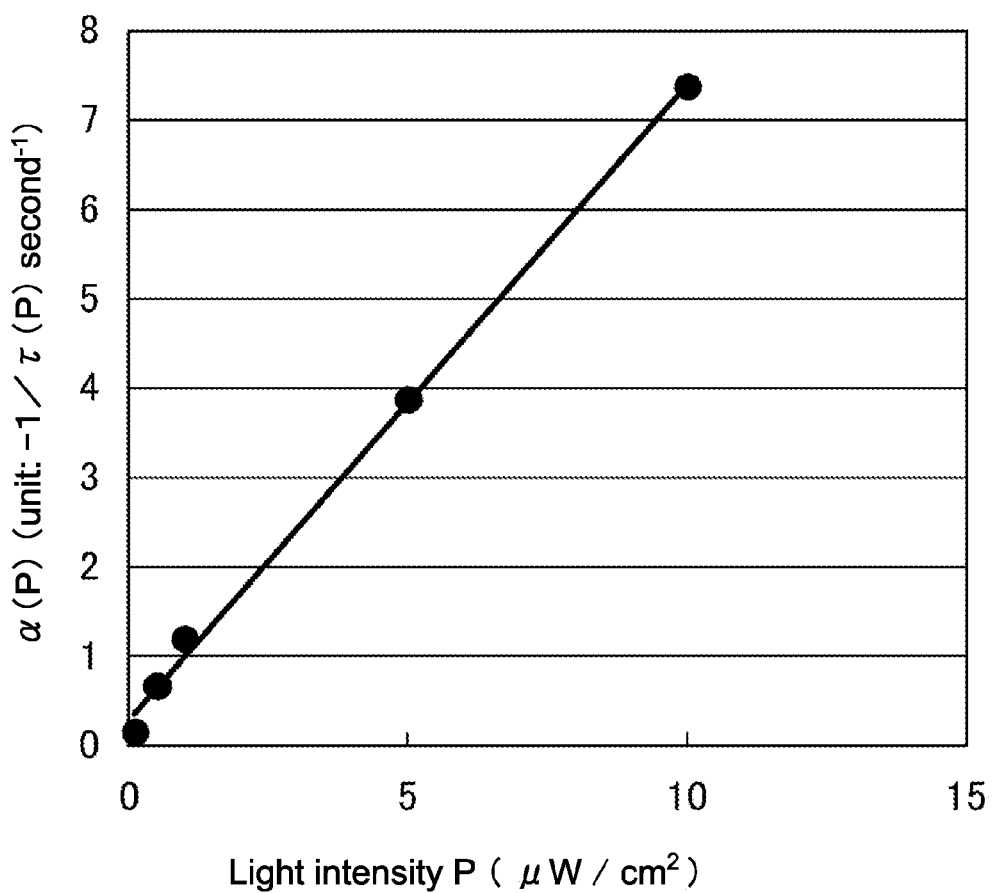
FIG. 3 is a graph showing a relationship between the light intensity P of the light irradiated to a photoelectric conversion material layer per unit time (unit: μW/cm$^2$) and a value [α(P)] having a unit of [−1/τ(P)] in Example 1.

The relationship between the charge current value (electric current $I_{inc}$) and the light intensity thus obtained is shown in FIG. 2. The abscissa in FIG. 2 represents the elapsed time t described above (unit: arbitrary), and the ordinate in FIG. 2 represents the electric current $I_{inc}$ described above. The relationship between the light intensity P of the light irradiated to the photoelectric conversion material layer 30 per unit time (unit: μW/cm$^2$) and the value [α(P)] having a unit of [−1/τ(P)] obtained is shown in FIG. 3. The abscissa in FIG. 3 represents the value of the light intensity P, while the ordinate represents the value [α(P)] having a unit of [−1/τ(P)], i.e., inverse of time constant τ(P). The curve "A" in FIG. 2 shows the results obtained when the light intensity P of the light having a wavelength of 565 nm per unit time is 10 μW/cm$^2$ as a voltage of 15 volt is applied to the first electrode 21 and the second electrode 22 is grounded; the curve "B" shows the results when it is 5 μW/cm$^2$; the curve "C" shows the results when it is 1 μW/cm$^2$; the curve "D" shows the results when it is 0.5 μW/cm$^2$; the curve "E" shows the results when it is 0.1 μW/cm$^2$; and the curve "F" shows the results when the light is not irradiated.

FIG. 2 shows that the charge current value is dependent on light intensity P. Alternatively, FIG. 3 shows that the value [α(P)] having a unit of [−1/τ(P)] can be expressed by a linear function of the light intensity P of the light irradiated to the photoelectric conversion material layer 30 per unit time, specifically by:

$$\alpha(P)=0.5644 \cdot P+0.4605$$

where $R^2=0.9743$.

However, the linear function is merely an example.

Since the function of electric current $I_{inc}$, the coefficient of Formula (1), and the time constant τ(P), respectively with a variable of light intensity P, are dependent on the configuration, structure, and constituent materials of the photoelectric conversion element 11, these functions should be determined by various tests, every time when the configuration, structure, or constituent materials of the photoelectric conversion element change, and these functions only needs to be stored in the current detection circuit 40 (or dedicated circuit or the like) or a table thereof only needs to be stored in the current detection circuit 40 (or dedicated circuit or the like).

In the photoelectric conversion element 11 of Example 1, the electric current generated in the photoelectric conversion material layer 30 increases with elapse of the irradiation time, when light at a certain light intensity is irradiated to the photoelectric conversion material layer 30 as bias voltage is applied between the first electrode 21 and the second electrode 22. It is thus possible to obtain a photoelectric conversion element with high sensitivity and high S/N ratio, by detecting the electric current.

Example 2

Example 2 is a variation of Example 1. Regarding the photoelectric conversion apparatus and the photoelectric conversion element of Example 2, the photoelectric conversion material layer 30 was constituted of the DNTT having a thickness of 10 nm. In order to produce the photoelectric conversion element 11 of Example 2, by vacuum deposition, the photoelectric conversion material layer 30 constituted of the DNTT having a thickness of 100 nm is formed on the protrusions 31 so as to extend from the first electrode 21. Except for the above-mentioned points, the configuration and the structure of the photoelectric conversion apparatus and the photoelectric conversion element of Example 2 are similar to those in the photoelectric conversion apparatus and the photoelectric conversion element of described in Example 1, and no detailed description thereof is provided.

Figure 4:
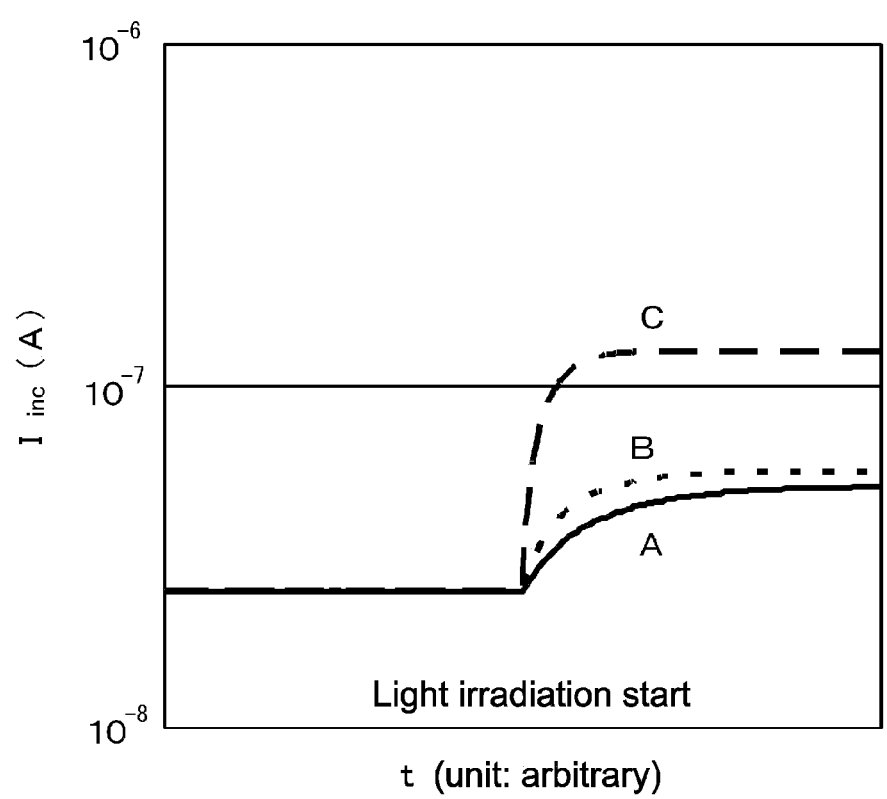
FIG. 4 is a graph showing a relationship between the charge current value and the light intensity in the photoelectric conversion element of Example 2.
Figure 5:
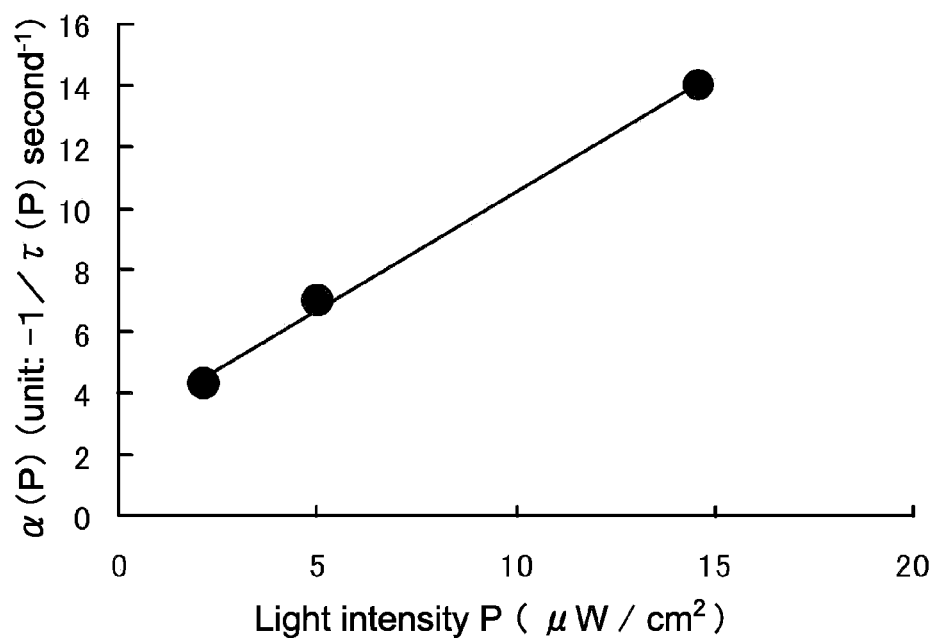
FIG. 5 is a graph showing a relationship between the light intensity P of the light irradiated to a photoelectric conversion material layer per unit time (unit: μW/cm$^2$) and a value [α(P)] having a unit of [−1/τ(P)] in Example 2.

The photoelectric conversion material layer 30 of the photoelectric conversion element 11 of Example 2 thus obtained is irradiated with light having a constant light intensity P of a wavelength of 440 nm via the transparent substrate 20 and the first electrode 21. It should be noted that −5 volts is applied to the first electrode 21, and the second electrode 22 is in a ground state. At this time, the photoelectric conversion apparatus and the photoelectric conversion element of Example 2 shows the same behavior as that of the photoelectric conversion apparatus and the photoelectric conversion element of Example 1. The relationship between the charge current value (current $I_{inc}$) and the light intensity is shown in FIG. 4. The abscissa and the ordinate in FIG. 4 are the same those in FIG. 2. The relationship between the light intensity P of the light irradiated to the photoelectric conversion material layer 30 per unit time (unit: μW/cm$^2$) and the value [α(P)] having a unit of [−1/τ(P)] is shown in FIG. 5. The abscissa and the ordinate in FIG. 5 are the same those in FIG. 3. The curve "A" in FIG. 4 shows the results obtained when the light intensity P of the light having a wavelength of 440 nm per unit time is 2 μW/cm$^2$ as −5 volts is applied to the first electrode 21 and the second electrode 22 is grounded; the curve "B" shows the results when it is 5 μW/cm$^2$; and the curve "C" shows the results when it is 15 μW/cm$^2$.

FIG. 4 shows that the charge current value is dependent on light intensity P. Alternatively, FIG. 4 shows that the value [α(P)] having a unit of [−1/τ(P)] can be expressed by a linear function of the light intensity P of the light irradiated to the photoelectric conversion material layer 30 per unit time, specifically by:

$$\alpha(P)=0.7655 \cdot P+2.9027$$

where $R^2=0.998$.

Example 3

Example 3 is a variation of Example 1 or Example 2. A photoelectric conversion element 12 of Example 3 is a photoelectric conversion element in the second configuration. As shown in the partial schematic cross-sectional view of FIG. 6A, a first electrode 21A is formed on a substrate 20A; a photoelectric conversion material layer 30 is formed on the first electrode 21A; and a second electrode 22A of a transparent conductive material is formed on the photoelectric conversion material layer 30. Light enters the photoelectric conversion material layer 30 through the second electrode 22A. Specifically, the substrate 20A is made, for example, of a silicon semiconductor substrate, the first electrode 21A is made of aluminum, and the second electrode 22A is made of ITO. Except for these points above, the configuration and the structure of the photoelectric conversion element 12 or the photoelectric conversion apparatus of Example 3 are similar to those in the photoelectric conversion element 11 or the photoelectric conversion apparatus of Example 1 or Example 2, and no detailed description thereof is provided.

Example 4

Example 4 is also a variation of Example 1 or Example 2. A photoelectric conversion element 13 of Example 4 is a photoelectric conversion element in the third configuration. As shown in the partial schematic cross-sectional view of FIG. 6B, a first electrode 21B and a second electrode 22B are formed on a substrate, and a photoelectric conversion material layer 30 is formed on the region of the substrate 20B extending from the first electrode 21B to the second electrode 22B. Light enters the photoelectric conversion material layer 30 through the second electrode 22B. Alternatively, light enters the photoelectric conversion material layer 30 through the substrate 20B or the first electrode 21B. Specifically, the substrate 20B is made, for example, of a silicon semiconductor substrate; the first electrode 21B and the second electrode 22B are made of a metal material or a transparent conductive material. Excepts for these points above, the configuration and the structure of the photoelectric conversion element 13 or the photoelectric conversion apparatus of Example 4 are similar to those of the photoelectric conversion element 11 or the photoelectric conversion apparatus in Example 1 or Example 2, and no detailed description thereof is provided.

Example 5

Example 5 is also a variation of Example 1 or Example 2. In Examples 1 to 4, the photoelectric conversion element has a two-terminal electronic device structure having the first electrode 21 and the second electrode 22. Alternatively in Example 5 and Examples 6 to 8 described below, the photoelectric conversion element has a three-terminal electronic device structure additionally having a control electrode. It is possible to modulate the flow of electric current by application of voltage to the control electrode. In Example 5, specifically, the configuration and the structure identical with those of a bottom gate/bottom contact-type FET were used for the three-terminal electronic device structure.

Figure 7A:
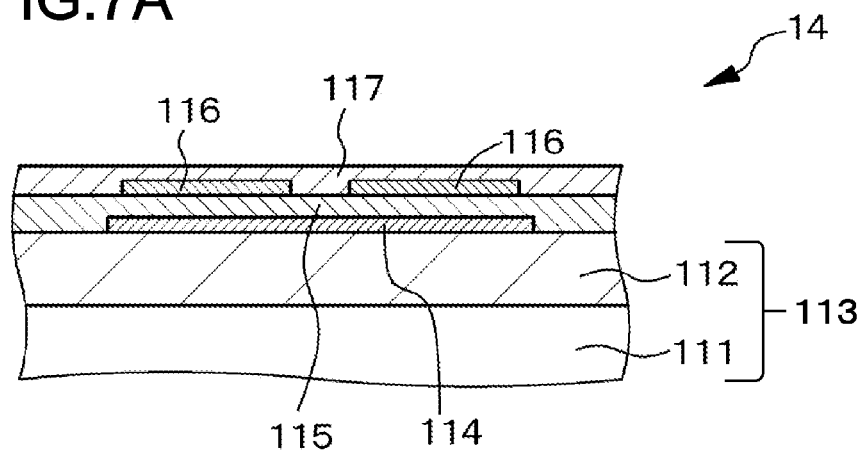
FIGS. 7A and 7B are partial schematic cross-sectional views respectively illustrating photoelectric conversion elements in a three-terminal electronic device structure of Examples 5 and 6.

More specifically, as shown in the partial schematic cross-sectional view of FIG. 7A, a photoelectric conversion element 14 of Example 5 in the bottom gate/bottom contact-type three-terminal electronic device structure has (a) a control electrode formed on a support 113 (corresponding to a gate electrode 114), (b) an insulation layer formed on the control electrode (gate electrode 114) and the support 113 (corresponding to gate insulation layer 115), (c) first and second electrodes formed on the insulation layer (gate insulation layer 115) (corresponding to source and drain electrodes 116), and (d) a photoelectric conversion material layer formed on the insulation layer (gate insulation layer 115) between the first and second electrodes (source and drain electrodes 116) (corresponding to a channel forming region 117).

The control electrode (gate electrode 114) is made of gold; the insulation layer (gate insulation layer 115) is made of $SiO_2$; and the support 113 is made of a silicon semiconductor substrate 111 and an insulation film 112 formed thereon. The first and second electrodes (source and drain electrodes 116) and the photoelectric conversion material layer (channel forming region 117) are made of the materials identical with those for the first electrode 21B, the second electrode 22B, and the photoelectric conversion material layer 30 in Example 4. In addition, the first and second electrodes (source and drain electrodes 116) are connected to a current detection circuit 40 not shown in the Figure. The same shall apply in the following Examples.

Hereinafter, the method of producing the photoelectric conversion element 14 of Example 5 will be described briefly.

[Step 500]

First, a gate electrode 114 is formed on a support 113. Specifically, a resist layer in which the region for the gate electrode 114 is previously removed (not shown in the Figure) is formed on the insulation film 112 by lithographic method. Then, a chromium (Cr) layer as an adhesion layer (not shown in the Figure) and a gold (Au) layer as the gate electrode 114 are formed one by one on the entire surface by vacuum deposition, and then, the resist layer is removed. It is possible in this way to obtain a gate electrode 114 by the so-called lift off method.

[Step 510]

Subsequently, a gate insulation layer 115 is formed on the support 113 carrying the gate electrode 114. Specifically, a gate insulation layer 115 of $SiO_2$ is formed on the gate electrode 114 and insulation film 112 by sputtering method. When the gate insulation layer 115 is formed, it is possible to form the connection region of the gate electrode 114 (not shown in the Figure) without photolithographic processing by covering part of the gate electrode 114 with a hard mask.

[Step 520]

Source and drain electrodes 116 are formed on the gate insulation layer 115. Specifically, a resist layer in which the regions for the source and drain electrodes 116 are previously removed is formed on the gate insulation layer 115 by lithographic method. The source and drain electrodes 116 are formed sequentially by vacuum deposition method and then, the resist layer is removed. It is possible in this way to obtain source and drain electrodes 116 by the so-called lift-off method.

[Step 530]

Subsequently, a channel forming region 117 is formed on the gate insulation layer 115 in a manner similar to Example 1 or Example 2.

[Step 540]

Finally, an insulating material layer as a passivation layer (not shown in the Figure) is formed on the entire surface; openings are formed in the insulating material layer above the source and drain electrodes 116; a wiring material layer is formed on the entire surface thereof including the areas in the openings; and a photoelectric conversion element 14 having a bottom gate/bottom contact-type FET (TFT) structure, which has wirings (not shown in the Figure) connected to the source and drain electrodes 116 formed on the insulating material layer, is formed by patterning the wiring material layer.

Example 6

Specifically in Example 6, the structure and the configuration identical with those of the bottom gate/top contact-type FET was used as the three-terminal electronic device structure.

Figure 7B:
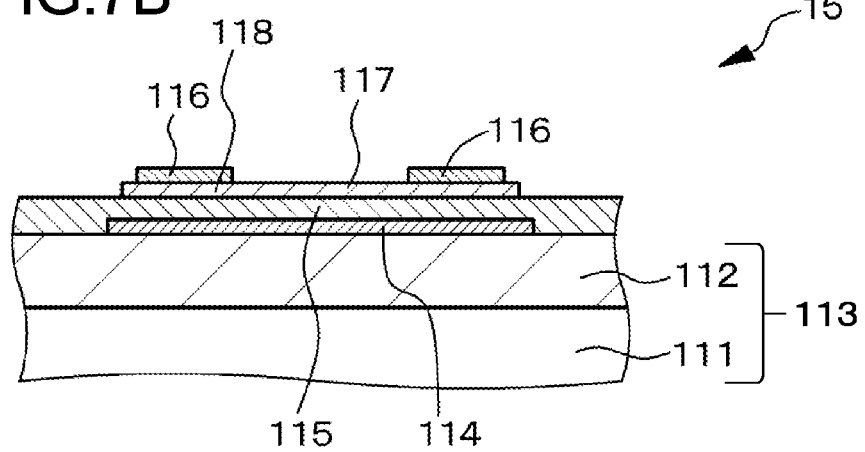

More specifically, as shown in the partial schematic cross-sectional view of FIG. 7B, a photoelectric conversion element 15 of Example 6 having a bottom gate/top contact-type three-terminal electronic device structure has (a) a control electrode formed on a support 113 (corresponding to a gate electrode 114), (b) an insulation layer formed on the control electrode (gate electrode 114) and the support 113 (corresponding to gate insulation layer 115), (c) a photoelectric conversion material layer (corresponding to channel forming region 117) and a peripheral region of the photoelectric conversion material layer 118 formed on the insulation layer (gate insulation layer 115), and (d) a first electrode/a second electrode formed on the peripheral region of the photoelectric conversion material layer 118 (corresponding to source and drain electrodes 116).

Hereinafter, the method of producing the photoelectric conversion element 15 of Example 6 will be described briefly.

[Step 600]

First, a gate electrode 114 is formed on a support 113 (insulation film 112), in a similar manner to [Step 500] of Example 5; and a gate insulation layer 115 is formed on the gate electrode 114 and the insulation film 112, in a similar manner to [Step 510].

[Step 610]

A channel forming region 117 and the peripheral region of the channel forming region 118 are then formed on the gate insulation layer 115 by a method similar to that in [Step 530].

[Step 620]

Source and drain electrodes 116 are then formed on the peripheral region of the channel forming region 118 as they hold the channel forming region 117 between them, similarly to [Step 520] in Example 5. However, it is possible to form the source and drain electrodes 116 without photolithographic processing, by covering the channel forming region 117 with a hard mask during formation of the source and drain electrodes 116.

[Step 630]

Finally, it is possible to obtain a photoelectric conversion element 15 having a bottom gate/top contact-type FET(TFT) structure by processing in a step similar to [Step 540].

Example 7

Specifically in Example 7, the configuration and structure identical with those of the top gate/bottom contact-type FET were used as the three-terminal electronic device structure.

More specifically, as shown in the partial schematic cross-sectional view of FIG. 7A, a photoelectric conversion element 16 of Example 8A having a top gate/bottom contact-type three-terminal electronic device structure has:

(a) a first electrode/a second electrode formed on a support 113 (corresponding to source and drain electrodes 116), (b) a photoelectric conversion material layer (corresponding to channel forming region 117) formed on the support 113 between the first and second electrodes (source and drain electrodes 116), (c) an insulation layer formed on the first and second electrodes (source and drain electrodes 116) and the photoelectric conversion material layer (channel forming region 117) (corresponding to gate insulation layer 115), and (d) a control electrode formed on the insulation layer (gate insulation layer 115) (corresponding to gate electrode 114).

Hereinafter, the method of producing the photoelectric conversion element 16 of Example 7 will be described briefly.

[Step 700]

First, source and drain electrodes 116 are formed on a support 113, in a similar manner to [Step 520] of Example 5.

[Step 710]

A channel forming region 117 is then formed on the support 113 (insulation film 112) between the source and drain electrodes 116 by a method similar to that of [Step 530]. In practice, the peripheral region of the channel forming region 118 is formed on the source and drain electrodes 116.

[Step 720]

A gate insulation layer 115 is then formed on the source and drain electrodes 116 and the channel forming region 117 (in practice, on the channel forming region 117 and the peripheral region of the channel forming region 118). Specifically, it is possible to obtain a gate insulation layer 115 by coating PVA on the entire surface by a spin coating method.

[Step 730]

A gate electrode 114 is then formed on the gate insulation layer 115. Specifically, a chromium (Cr) layer as adhesion layer (not shown in the Figure), and a gold (Au) layer as gate electrode 114 are formed on the entire surface sequentially by a vacuum deposition method. It is possible to form the gate electrode 114 without photolithographic processing, by covering part of the gate insulation layer 115 with a hard mask during formation of the gate electrode 114. Finally, it is possible to obtain a photoelectric conversion element 16 having a top gate/bottom contact-type FET(TFT) structure, by processing in a step similar to [Step 540].

Example 8

Specifically in Example 8, the configuration and the structure identical with those of the top gate/top contact-type FET was used as the three-terminal electronic device structure.

More specifically, as shown in the partial schematic cross-sectional view of FIG. 8B, a photoelectric conversion element 17 of Example 8 having a top gate/top contact-type three-terminal electronic device structure has (a) a photoelectric conversion material layer (corresponding to channel forming region 117) and the peripheral region of the photoelectric conversion material layer 118 formed on a support 113, (b) a first electrode and a second electrode formed on the peripheral region of the photoelectric conversion material layer 118 (corresponding to source and drain electrodes 116), (c) an insulation layer formed on the first and second electrodes (source and drain electrodes 116) and the photoelectric conversion material layer (channel forming region 117) (corresponding to gate insulation layer 115), and (d) a control electrode formed on the insulation layer (gate insulation layer 115) (corresponding to gate electrode 114).

Hereinafter, the method of producing the photoelectric conversion element 17 of Example 8 will be described briefly.

[Step 800]

First, the channel forming region 117 and the peripheral region of the channel forming region 118 are formed on the support 113 by a method similar to that in [Step 530].

[Step 810]

Source and drain electrodes 116 are then formed on the peripheral region of the channel forming region 118 as they hold the channel forming region 117 between them, in a similar manner to [Step 520] in Example 5. It is possible to form the source and drain electrodes 116 without photolithographic processing, by covering the channel forming region 117 with a hard mask during formation of the source and drain electrodes 116.

[Step 820]

A gate insulation layer 115 is then formed on the source and drain electrodes 116 and the channel forming region 117. Specifically, it is possible to obtain a gate insulation layer 115 by coating the entire surface with PVA by spin coating method.

[Step 830]

A gate electrode 114 is then formed on the gate insulation layer 115, in a similar manner to [Step 730] of Example 7. It is possible, by finally executing processing in a step similar to [Step 540], to obtain a photoelectric conversion element 17 having a top gate/top contact-type FET(TFT) structure.

Example 9

Example 9 relates to a solid-state imaging apparatus having one of the photoelectric conversion apparatuses or photoelectric conversion elements described in Examples 1 to 4.

Figure 9:
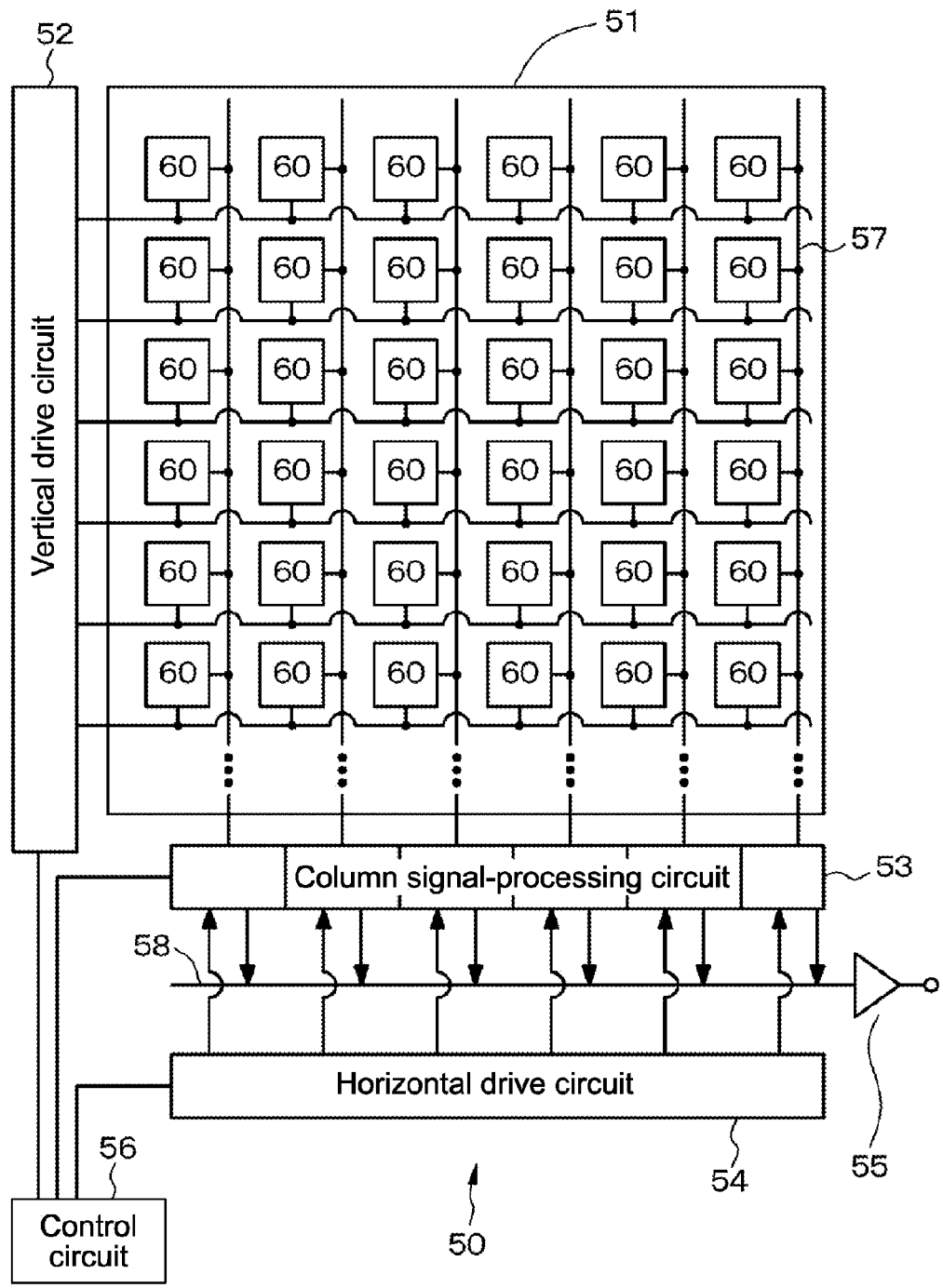
FIG. 9 is a schematic diagram showing a solid-state imaging apparatus of Example 9.

FIG. 9 is a schematic diagram showing the solid-state imaging apparatus (solid-state imaging element) of Example 9. A solid-state imaging apparatus 50 of Example 9 has an imaging region 51 including photoelectric conversion elements 60 described in any one of Examples 1 to 4 (photoelectric conversion elements 11, 12 or 13) aligned in a two-dimensional array on a semiconductor substrate (such as Si substrate), and peripheral circuits such as a vertical drive circuit 52, a column signal-processing circuit 53, a horizontal drive circuit 54, an output circuit 55, and a control circuit 56. These circuits may be formed with known circuits or circuits with different circuit configurations (for example, various circuits used in known CCD and CMOS imaging apparatuses).

The control circuit 56 generates clock and control signals, standards of operation of the vertical drive circuit 52, the column signal-processing circuit 53, and the horizontal drive circuit 54, based on vertically synchronized signal, horizontally synchronized signal, and master clock. The generated clock and control signals are inputted into the vertical drive circuit 52, the column signal-processing circuit 53, and the horizontal drive circuit 54.

The vertical drive circuit 52, which has, for example, shift registers, selects and scans the photoelectric conversion elements 60 in the imaging region 51 sequentially by line in a vertical direction. A pixel signal based on the electric current (signal) generated according to the intensity of the light received in each photoelectric conversion element 60 is transmitted to the column signal-processing circuit 53 via a vertical signal wire 57.

The column signal-processing circuit 53, which is installed, for example, in every line of the photoelectric conversion elements 60, processes the signals outputted from the photoelectric conversion elements 60 in each line for removal of noises and amplification of signal in each photoelectric conversion element, based on the signal from black standard pixel (not shown in the Figure, formed in the region surrounding the effective pixel region). In the output stage of the column signal-processing circuit 53, a horizontal selection switch (not shown in the Figure) is installed as it is connected to a horizontal signal wire 58.

The horizontal drive circuit 54, which has, for example, shift registers, sequentially selects each of the column signal-processing circuits 53 by outputting horizontal scanning pulses sequentially and outputs a signal from each of the column signal-processing circuits 53 to the horizontal signal wire 58.

The output circuit 55 processes the signal sequentially transmitted from each of the column signal-processing circuits 53 via the horizontal signal wire 58 and outputs the processed signal.

Figure 10:
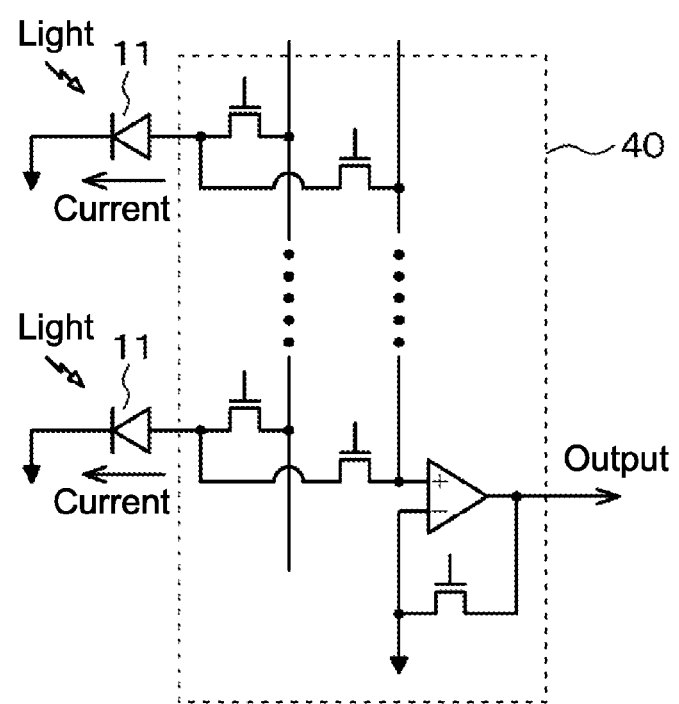
FIG. 10 is a circuit diagram showing an example of a current detection circuit.

An example of part of the current detection circuit 40 is shown in FIG. 10. A current detection circuit 40 is formed, for example, for one line of photoelectric conversion elements 60. The current detection circuit 40 is formed in the column signal-processing circuit 53. Alternatively, a current detection circuit 40 may be formed for each photoelectric conversion element 60. In the current detection circuit 40 shown in FIG. 10, the electric potential generated at the terminal of resistor by the electric current generated in the photoelectric conversion element 60 is converted into voltage, as it is inputted into a non-inverting amplifier. It The current detection circuit 40 shown in FIG. 10 is applicable to other Examples and also that current detection circuits in other configuration or structure can also be used.

Although it depends on the materials constituting the photoelectric conversion material layer, the photoelectric conversion material layer itself may have a function as color filter, and thus color separation is possible even if no color filter is formed. A known color filter permitting transmission of particular wavelength such as red, green, blue, cyan, magenta or yellow may be installed as needed above a light-entering side of the photoelectric conversion element 60. In addition, the solid-state imaging apparatus may be a front-face irradiation-type apparatus or a rear-face irradiation-type apparatus. A shutter for control of the incident light into the photoelectric conversion element 60 may also be formed as needed.

The structure, configuration, production condition, production method, and materials used of the photoelectric conversion apparatuses, the photoelectric conversion elements, and the solid-state imaging apparatuses described in Examples are nothing but examples, and may be modified as needed. For operation of the photoelectric conversion apparatus according to the embodiment as a photovoltaic cell, the photoelectric conversion material layer is irradiated with light while no voltage is applied between the first electrode and the second electrode. In such a case, the current detection circuit for detection of the current generated in the photoelectric conversion material layer may not be necessary.

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

The invention is claimed as follows:

1. A method of detecting a change in current, comprising:
irradiating light on at least one photoelectric conversion material layer; and
detecting, by current detection circuit, an increased change in current generated in the photoelectric conversion material layer with elapse of irradiation time of the light, wherein the increased change in the current is configured to be detected based on a time constant of the changes in the current in a current increasing period from a first time to a second time, wherein the second time occurs at or before a time of transition from the current increasing period to a current decreasing period.

2. The method of detecting the change in current according to claim 1, further comprising detecting a current $I_{inc}$ in the current increasing period according to the following formula (1):

$$I_{inc}=C_1*I_0(P)*[1-e^{(-t/\tau(P))}]+C_2 \qquad (1)$$

wherein $\tau(P)$ represents the time constant of the changes in the current in the current increasing period from the first time to the second time,
wherein t represents the elapsed time from the first time to the second time,
wherein $I_0(P)$ represents a current configured to be generated in the photoelectric conversion material layer based on light, at an intensity P, irradiated on the photoelectric conversion material layer in an event t=∞, and
wherein $C_1$ and $C_2$ represent constants.

3. The method of detecting the change in current according to claim 2, further comprising calculating an integral current value by integrating formula (1) from t=0 to about t=100 milliseconds.

4. The method of detecting the change in current according to claim 1,
wherein the photoelectric conversion material layer is formed between a first electrode and a second electrode,
the method further comprising:
detecting changes in the current generated in the photoelectric conversion material layer from the first time, corresponding with at least one of an initiation of irradiation of light on the photoelectric conversion material layer, or an initiation of voltage application to the first electrode and the second electrode, to the second time occurring after the first time.

5. The method of detecting the change in current according to claim 4, wherein the changes in the current generated in the photoelectric conversion material layer from the first time to the second time correspond to changes in charge current in a capacitor defined by the first electrode, the second electrode, and the photoelectric conversion material layer.

6. The method of detecting the change in current according to claim 5, further comprising detecting the time constant of the changes in the current in the current increasing period from the first time to the second time as $\tau(P)$,
wherein $\tau(P)$ is a function of a light intensity P per unit time of the irradiation of the light on the photoelectric conversion material layer.

7. The method of detecting the change in current according to claim 1, wherein the photoelectric conversion material layer includes at least one organic semiconductor material of organic colorants represented by quinacridone and derivatives thereof, colorants of an early transition metal ion chelated by an organic material represented by Alq3 [tris(8-quinolinolato)aluminum(III)], or organic metal colorants having a complex between a transition metal ion and an organic material represented by phthalocyanine zinc (II).

8. The method of detecting the change in current according to claim 1, wherein the photoelectric conversion material layer includes at least one of organic metal compounds, organic semiconductor fine particles, metal oxide semiconductors, inorganic semiconductor fine particles, core-shell materials, or organic/inorganic hybrid compounds.

9. The method of detecting the change in current according to claim 1, wherein the photoelectric conversion material layer has a carrier mobility of less than or equal to 10 cm$^2$/V*second.

10. A photoelectric conversion apparatus, comprising:
a photoelectric conversion element including at least one photoelectric conversion material layer; and
a current detection circuit electrically connected to the photoelectric conversion element,
wherein the current detection circuit is configured to detect an increased change in current generated in the photoelectric conversion material layer with elapse of irradiation time of light, from a first time corresponding with an initiation of irradiation of the light on the photoelectric conversion material layer, wherein the increased change in the current is configured to be detected based on a time constant of the changes in the current in a current increasing period from the first time to a second time, wherein the second time occurs at or before a time of transition from the current increasing period to a current decreasing period.

11. The photoelectric conversion apparatus according to claim 10, further comprising a first electrode and a second electrode, the photoelectric conversion material layer is disposed between the first electrode and the second electrode.

12. The photoelectric conversion apparatus according to claim 11,
wherein the first electrode comprises a transparent conductive material on a transparent substrate,
wherein the photoelectric conversion material layer is on the first electrode, and
wherein the second electrode is on the photoelectric conversion material layer.

13. The photoelectric conversion apparatus according to claim 11,
wherein the first electrode is on a substrate,
wherein the photoelectric conversion material layer is on the first electrode, and
wherein the second electrode comprises a transparent conductive material on the photoelectric conversion material layer.

14. The photoelectric conversion apparatus according to claim claim 11,
wherein the first electrode and the second electrode are on a substrate, and
wherein the photoelectric conversion material layer is on the substrate in a region between the first electrode and the second electrode.

15. The photoelectric conversion apparatus according to claim 10, wherein the current detection circuit is further configured to detect current $I_{inc}$ in the current increasing period based on the following formula (1):

$$I_{inc} = C_1 * I_0(P) * [1 - e^{(-t/\tau(P))}] + C_2 \quad (1)$$

wherein $\tau(P)$ represents the time constant of the changes in the current in the current increasing period from the first time to the second time,
wherein t represents the elapsed time from the first time to the second time,
wherein $I_0(P)$ represents a current configured to be generated in the photoelectric conversion material layer based on light, at an intensity P, irradiated on the photoelectric conversion material layer in an event t=∞, and wherein $C_1$ and $C_2$ represent constants.

16. The photoelectric conversion apparatus according to claim 15, wherein the current detection circuit is further configured to calculate an integral current value by integration of formula (1) from t=0 to about t=100 milliseconds.

17. The photoelectric conversion apparatus according to claim 10,
wherein the photoelectric conversion material layer is configured to detect the time constant of the changes in the current in the current increasing period from the first time to the second time as $\tau(P)$, and
wherein $\tau(P)$ is a function of a light intensity P per unit time of the irradiation of the light on the photoelectric conversion material layer.

18. The photoelectric conversion apparatus according to claim 10, wherein the photoelectric conversion material layer includes at least one organic semiconductor material of organic colorants represented by quinacridone and derivatives thereof, colorants of an early transition metal ion chelated by an organic material represented by Alq3 [tris(8-quinolinolato)aluminum(III)], or organic metal colorants having a complex between a transition metal ion and an organic material represented by phthalocyanine zinc (II).

19. The photoelectric conversion apparatus according to claim 10, wherein the photoelectric conversion material layer includes at least one of organic metal compounds, organic semiconductor fine particles, metal oxide semiconductors, inorganic semiconductor fine particles, core-shell materials, or organic/inorganic hybrid compounds.

20. The photoelectric conversion apparatus according to claim 10, wherein the photoelectric conversion material layer has a carrier mobility less than or equal to 10 $cm^2$/V*second.

21. The photoelectric conversion apparatus according to claim 10, wherein the current detection circuit is further configured to detect the increased change in current generated in the photoelectric conversion material layer with elapse of the irradiation time from the first time, corresponding with an initiation of voltage application to the photoelectric conversion material layer, to the second time occurring after the first time.

22. A solid state imaging apparatus, comprising:
an imaging region including at least one photoelectric conversion element having at least one photoelectric conversion material layer; and
a current detection circuit electrically connected to the at least one photoelectric conversion element,
wherein the current detection circuit is configured to detect an increased change in current generated in the photoelectric conversion material layer with elapse of irradiation time of light, from a first time corresponding with an initiation of irradiation of the light on the photoelectric conversion material layer, wherein the increased change in the current is configured to be detected based on a time constant of the changes in the current in a current increasing period from the first time to a second time, wherein the second time occurs at or before a time of transition from the current increasing period to a current decreasing period.

23. The solid state imaging apparatus according to claim 22,
wherein the imaging region further includes a plurality of photoelectric conversion elements arranged in an array, and
wherein each of the plurality of photoelectric conversion elements includes a first electrode, a second electrode, and a photoelectric conversion material layer disposed between the first electrode and the second electrode.

24. The solid state imaging apparatus according to claim 23, further comprises a plurality of current detection circuits, wherein each of the plurality of photoelectric conversion elements is connected to a different one of the plurality of current detection circuits.

25. The solid state imaging apparatus according to claim 23,
wherein the array is a two-dimensional array including rows and columns, and
wherein the current detection circuit is to handle a row or a column of photoelectric conversion elements.

* * * * *